United States Patent [19]

Kukanskis et al.

[11] Patent Number: 5,032,427
[45] Date of Patent: Jul. 16, 1991

[54] PROCESS FOR PREPARATION PRINTED CIRCUIT THROUGH-HOLES FOR METALLIZATION

[75] Inventors: Peter E. Kukanskis, Woodbury; Joseph J. D'Ambrisi, Trumbull; John J. Kuzmik, Torrington, all of Conn.

[73] Assignee: MacDermid, Incorporated, Waterbury, Conn.

[21] Appl. No.: 431,680

[22] Filed: Nov. 3, 1989

Related U.S. Application Data

[63] Continuation of Ser. No. 186,105, Apr. 25, 1988, abandoned.

[51] Int. Cl.$^5$ ............................................. C23C 26/00
[52] U.S. Cl. .................................... 427/97; 427/98; 427/306; 427/307
[58] Field of Search ............ 427/97, 306, 307, 98

[56] References Cited

U.S. PATENT DOCUMENTS

| | | | |
|---|---|---|---|
| 3,472,664 | 10/1969 | Bastenbeck | 427/306 |
| 3,790,400 | 2/1974 | Kuzmik | 427/307 |
| 3,898,136 | 8/1975 | Yonemitsu | 427/307 |
| 4,316,322 | 2/1982 | Tranberg | 427/307 |
| 4,415,829 | 5/1985 | Deckert et al. | 427/97 |
| 4,425,380 | 4/1984 | Nuzzi et al. | 427/97 |
| 4,597,988 | 7/1986 | Kukanskis et al. | 427/97 |
| 4,601,783 | 7/1986 | Krulik | 427/307 |
| 4,601,784 | 7/1986 | Krulik | 427/307 |
| 4,629,636 | 12/1986 | Courduvelis | 427/306 |
| 4,639,380 | 1/1987 | Amelio | 427/97 |
| 4,701,350 | 10/1987 | Lindsay | 427/97 |
| 4,775,557 | 10/1988 | Bastenbeck | 427/304 |
| 4,820,548 | 4/1989 | Courduvelis | 427/97 |
| 4,873,122 | 10/1989 | Dauken | 427/306 |

FOREIGN PATENT DOCUMENTS

| | | |
|---|---|---|
| 990593 | 6/1976 | Canada ............... 427/306 |
| 8505755 | 12/1985 | PCT Int'l Appl. |
| 1479556 | 7/1977 | United Kingdom. |

OTHER PUBLICATIONS

Milton J. Rosen et al., "Systematic Analysis of Surface-Active Agents", Wiley-Interscience, 1972, pp. 39-41.

Peter E. Kukanskis, "Improved Smear Removal Process for Multilayer Circuit Boards".

F. Tomaiuolo & P. Montangero, "Alkaline Permanganate Treatment in Etch-Back Processes", 1986.

*Primary Examiner*—Shrive Beck
*Attorney, Agent, or Firm*—St Onge Steward Johnston & Reens

[57] ABSTRACT

Disclosed herein is a process for preparing the surfaces of through-holes in printed circuit boards (especially multilayer printed circuit boards) for subsequent metallization, in which the through-hole surfaces are treated with a substantially water-immiscible organic liquid which acts upon the insulating substrate of the board, and preferably in the form of a substantially homogeneous, clear mixture comprised of the water-immiscible organic liquid, water, an alkali metal compound and a surfactant component, followed by treatment of the through-hole surfaces with an alkaline permanganate solution. The process can be used as a desmearing and/or etch-back process, a combined desmearing-conditioning process, or a conditioning process following a separate desmearing process.

10 Claims, No Drawings

PROCESS FOR PREPARATION PRINTED CIRCUIT THROUGH-HOLES FOR METALLIZATION

This is a continuation of copending application Ser. No. 07/186,105 filed on Apr. 25, 1988, now abandoned.

BACKGROUND OF THE INVENTION

This invention relates to the manufacture of printed circuit boards and, more particularly, to a process for treating the surfaces of interconnecting through-holes in printed circuit boards to prepare the surfaces for subsequent metallization.

It is now commonplace in the art to provide printed circuit boards having more than one plane or layer of circuitry, wherein the layers of circuitry are separated one from the other by an insulating substrate material, i.e., a dielectric. In the simplest version of such printed circuit boards, an insulating substrate material is provided on both sides with conductive circuit patterns. In other versions, which have become enormously popular over the past several years, a so-called multilayer circuit board is provided. These multilayer boards are comprised of one or more innerlayers of conductive circuitry in addition to layers of circuitry on the outer-facing surfaces of the board, with insulating substrate material separating each layer or innerlayer of circuitry.

In order to provide conductive interconnection between or among the circuitry layers and/or innerlayers in printed circuit boards, one or more through-holes are formed in the board (i.e., normal to the plane of the board) and the wall surfaces of the through-holes are then metallized.

Since the metallized through-holes provide the means for conductive interconnection between or among circuitry layers and/or innerlayers, the quality of the metal layer provided on the through-hole surfaces is extremely important. In particular, it is necessary that the metal deposit adhere tightly to the through-hole surfaces and that the metal deposit be in the form of an essentially continuous, void-free, layer. While to a degree these quality parameters are dependent upon the nature of the metal depositing solution employed and the conditions under which metallization is carried out, to a more significant degree these parameters are dependent upon the receptivity of the through-hole surfaces to acceptance of the metal layer.

Generally speaking, through-hole metallization is accomplished through use of electroless metal depositing solutions which require that the surfaces to be coated with the metal be catalyzed to promote the electroless deposition. Numerous techniques and proposals exist in the art for treating or conditioning through-hole surfaces so as to enhance their receptivity to the deposit of catalytic species and to the subsequently-applied electroless metal deposit so as to arrive at an adherent, void-free metal coating effective to provide the desired conductive interconnection between or among circuitry layers on or in the board.

Multilayer printed circuit boards pose unique problems in through-hole metallization. In the formation of through-holes (e.g., by drilling) in these boards, the edge portions of metal innerlayers which are exposed at the hole surfaces can become "smeared" with the dielectric material. Such smeared innerlayer surfaces at the through-hole exhibit poor receptivity to catalyst and deposited metal and lead to lack of adherence and/or incomplete coverage with respect to the metal deposit. Accordingly, it is known in the art to "desmear" through-hole surfaces to remove resinous smear from circuitry innerlayers at the through-hole surfaces, such as by vapor honing, secondary drilling, plasma etching or, more commonly, by the action of chemicals such as sulfuric acid, chromic acid or alkaline (e.g., sodium, potassium) permanganate. In the course of desmearing processes, particularly when chemical means are employed, the process also is known to "etch back" the dielectric material at the hole surfaces, thereby exposing more of the metal circuitry innerlayer surface at the through hole surfaces and aiding in subsequent adhesion of catalyst and deposited metal.

The utilization of permanganate to desmear and/or etch-back and/or clean through-holes so as to condition the through-hole surfaces for subsequent metallization has received considerable attention in the art. British Patent Specification No. 1,479,556 describes a process for removing resin smear from printed circuit board through-holes and from holes made in wire assemblies by contacting the hole surfaces with an alkaline permanganate solution having a pH of 13-14 at a temperature between 35° and 70° C., preferably also containing a wetting agent of the fluorocarbon variety.

U.S. Pat. No. 4,425,380 to Nuzzi, et al. also relates to the desmearing of through-holes in printed circuit boards and in wire assemblies, employing a process involving contact of the hole surfaces with an alkaline permaganate solution, followed by contact with compounds effective to remove manganese residues from the surfaces so as to avoid interference of these species with the subsequent electroless depositing step.

In permanganate-based desmear/etch-back processes for through-holes formed in circuit boards wherein the insulating substrate material is epoxy (e.g., glass-reinforced epoxy resin), the art also has taught that the efficiency or effectiveness of the permanganate treatment generally can be enhanced by first treating the through-hole surfaces with a solvent for the epoxy to open up or soften or swell the epoxy resin structure. See, e.g., Kukanskis, "Improved Smear Removal Process For Multilayer Circuit Boards", IPC Technical Paper No. 435 (Oct., 1982); F. Tomaivolo, et al., "Alkaline Permanganate Treatment In Etch-Back Processes," Trans IMF, 1986, 64, 80; U.S. Pat. No. 4,515,829 to Deckert, et al.; U.S. Pat. No. 4,592,852 to Courduvelis, et al.; and published PCT patent application No. WO 85/05755 to DelGobbo, et al. In this same vein, there is described in the art a method for post-desmear treatment of through-holes to better prepare them for subsequent metallization, in which the through-hole, after being desmeared, is treated with a solvent for the substrate resin, followed by treatment with an alkaline permanganate solution. See, e.g., U.S. Pat. No. 4,597,988 to Kukanskis, et al.

The epoxy solvents described in pre-permanganate treatment processes of the foregoing references are of the water-soluble type, a choice dictated by the desirability of using these solvents in aqueous solution and by the desirability of facilitating rinsing by insuring that the solvents will be miscible with rinsing water. It has been found in accordance with the present invention that, notwithstanding the desirability of employing water-soluble solvents, the effectiveness of alkaline permanganate treatment in cleaning and/or desmearing and/or etch back and/or post-desmear conditioning processes for through-holes, particularly those in boards where the dielectric is epoxy-based or contains epoxy, is generally enhanced through contact of the through-hole surfaces, prior to the permanganate treatment, with water-immiscible organic liquids which serve to penetrate and/or soften and/or swell and/or otherwise act upon the dielectric material.

According to another aspect of the invention, the water-immiscible organic liquid is used in association with water and, optionally, other water-soluble compounds, in order to enhance removal of the water-immiscible organic liquid by subsequent water rinsing and, importantly, to provide a pre-permanganate treatment which will be optimally effective irrespective of the composition of the dielectric, for example, whether it be epoxy-based or a polyimide or other thermosetting or thermoplastic material, or the like.

SUMMARY OF THE INVENTION

In its broadest terms, the invention comprises a process for treating (e.g., cleaning and/or desmearing and/or etching back and/or conditioning after a previous desmear or etch-back process) the through-hole surfaces in printed circuit boards, particularly multi-layer circuit boards, to prepare them for subsequent metallization, the process steps comprising a first contact of the through-hole surfaces with a water-immiscible organic liquid which acts upon the insulating substrate material of which the circuit board is composed, followed by contact of the surfaces with an aqueous alkaline solution containing permanganate ions until the particular effect (e.g., desmearing or etch-back or conditioning) is brought about.

Following the treatment, and optionally other treatments, the through-hole is metallized, typically by an electroless metal deposition process in which the surfaces are first catalyzed or activated, to provide an adherent, essentially void-free metal layer on the through-hole surfaces.

The process of the invention, to the extent involving utilization of water-immiscible organic liquids prior to an alkaline permanganate treatment, has particular applicability to treatment of through-holes in circuit boards wherein the insulating substrate material is epoxy or epoxy-based (e.g., glass-filled or -reinforced epoxy) or epoxy-containing. As earlier noted, it has been found that the water-soluble solvents employed in the prior art in processes for treating through-holes in epoxy-based boards prior to a permanganate treatment, while advantageous because of ease of contact and rinsing, may not be as effective as water-immiscible organic liquids in enhancing the effectiveness of the subsequent permanganate treatment.

Another aim of the present invention addresses the desire to provide the user with a single treatment composition, for use preparatory to permanganate treatment, which is equally (i.e., highly) effective—in enhancing permanganate effectiveness and efficiency—irrespective of the material used as the insulating substrate material in the circuit board and, specifically, irrespective of whether the board is composed of epoxy-based or polyimide material.

As noted, and according to the invention, the water-immiscible organic liquids are those of choice for the commonly-employed epoxy-based printed circuit boards. However, for the processing of printed circuit boards substantially based upon non-epoxy materials, e.g., polyimide, these same water-immiscible organic liquids, alone, are not as effective in acting upon polyimide-based boards so as to enhance subsequent permanganate treatment. Indeed, the most effective such pretreatments found for use with polyimide-based boards are those containing alkali metal compounds (e.g., caustic). Since these compounds are water-soluble, their use, in turn, requires that aqueous systems and water-soluble organic solvents be employed in arriving at a suitable pretreatment composition for polyimide-based printed circuit boards.

On the one hand, then, the pre-permanganate processing of typical epoxy boards has been found to be most advantageously carried out utilizing water-immiscible organic liquids, while the pre-permanganate processing of many other board types (e.g., polyimide-based) has been found to be most advantageously carried out utilizing systems containing water-soluble alkali metal compounds and, hence, requiring water and water-soluble organic solvents.

In order to compatabilize these inconsistent requirements, the present invention makes use of an admixture comprised of water-immiscible organic liquid, water and an alkali metal compound, in the form of a substantially homogeneous, substantially clear mixture as achievable utilizing any of a wide variety of suitable materials (which may be commonly referred to as surfactants, wetting agents, coupling agents or emulsifiers).

By proceeding in this manner, the invention provides a pre-permanganate treatment composition which, by reason of the presence therein of water-immiscible organic liquid, is highly effective for use with epoxy boards and, by reason of the presence therein of the aqueous component, in which the alkali-metal compound is dissolved, is highly effective for use with boards other than those based substantially on epoxy materials, e.g., polyimide-based boards. In addition, by reason of the aqueous component, the composition can effectively be rinsed from the through-hole surfaces using conventional water rinses.

In the present invention, then, a process is provided for treating a printed circuit board through-hole to prepare it for subsequent metallization. This process has applicability to through-holes formed in double-sided printed circuit boards and in multi-layer printed circuit boards, although it is in the latter case where the invention demonstrates its most significant applicability. The process can be employed, for example, to desmear and/or etch back a multilayer board through-hole surface, following which the through-hole is metallized, or can be employed as a post-desmear and/or post-etchback treatment to further prepare a multilayer board through-hole surface for metallization. In all such cases, it is found that the process of the invention provides through-hole surfaces which possess a micro-roughened topography which is ideally suited for accepting an adherent, essentially void-free metal deposit.

DETAILED DESCRIPTION OF THE INVENTION

In a typical manufacturing sequence for printed circuit boards involving the process of the present invention, an insulating substrate material, which may be metal- (e.g., copper foil) clad on one or both sides and which may contain one or more metal innerlayers separated by insulating substrate material, is employed as the starting material. The substrate material may be any suitable non-conductive, insulating material, such as thermosetting or thermoplastic resins, inorganic materials such as mica, and the like, and may be filled or reinforced with various inorganic materials such as glass. Based upon the current state of technology, the most widely used insulating substrate materials will be either epoxy-based (e.g., glass-filled epoxy resins of the difunctional or tetrafunctional epoxy type or cresol or phenol novolaks, bis-maleimide triazine, and the like) or polyimide-based compositions.

Through-holes are punched or drilled in the starting board and, according to one embodiment of the invention, the through-hole surfaces thus exposed are then treated to prepare them for subsequent metallization so as to provide conductive interconnection between or among the layers and/or innerlayers of metal circuitry provided on or within the board surfaces. In this treatment process, the through-hole surfaces are contacted with a water-immiscible organic liquid or with a composition, containing a water-immiscible organic liquid (e.g., the previously-noted homogeneous clear mixtures), which has the overall effect of acting upon the insulating substrate material in a way which enhances the effectiveness of the subsequent permanganate treatment. Thereafter, typically after rinsing the through-hole surfaces with water, the through-hole surfaces are contacted with an alkaline solution containing permanganate ions (e.g., as made using potassium or sodium permanganate). By virtue of the pre-treatment with water-immiscible organic liquid and the conditions of permanganate treatment, the permanganate solution effects a micro-roughening of the insulating substrate material exposed at the hole surfaces so as to alter the surface topography in a way which increases receptivity of the surfaces to, e.g., adsorption of the catalytic species used in electroless metal depositing and adherence of the subsequent electroless metal deposit.

The process as above-described can constitute the sole preparation of the through-hole surfaces or can form a part of a multi-treatment hole preparation process. For example, the water-immiscible organic liquid/permanganate process cycle can be relied upon to effect any required desmearing and etchback of the through-hole surfaces and, following rinsing and preferably treatment to remove and/or neutralize any residual manganese species, then proceed to the metallization process. Alternatively, however, any required desmearing and/or etch-back can be preliminary accomplished by any of the means known in the art (e.g., secondary drilling, vapor honing, plasma treatment, contact with acids such as chromic acid or sulfuric acid, contact with alkaline permanganate solutions), following which the water-immiscible organic liquid contact/permanganate contact cycle of the present invention is then employed to further prepare the through-hole surfaces for metallization. See, e.g., U.S. Pat. No. 4,597,988 to Kukanskis for a discussion of this post-desmear processing sequence. Indeed, the process of the present invention may be employed in a cycle wherein the through-hole is first treated in accordance with the water-immiscible organic liquid/permanganate process combination of the invention (e.g., to effect desmearing and etch-back) and then further treated with the same water-immiscible organic liquid/permanganate contacting steps to effect yet further preparation of the through-hole surfaces.

With respect to the subsequent metallization of the through-holes after treatment in accordance with the invention, any number of techniques can be employed. However, the typical process is one of electroless metal deposition in which the surfaces to be plated are first activated by adsorption thereon of species (or precursors thereof) catalytic to the metal depositing process. The most commonly-employed catalytic materials for this process are tin-palladium catalysts, used in a one-step activation process involving true or colloidal solutions of tin and palladium chloride. See, e.g., U.S. Pat. No. 3,011,920 and U.S. Pat. No. 3,532,518. This activation process is generally followed by an acceleration step which functions either to remove excess tin deposits or alter the valence of the tin compounds or other mechanism to stabilize the catalyst on the substrate surface and ensure its exposure in the subsequent electroless metallization. Where an acceleration step is employed, particularly preferred is the use of an oxidizing accelerator as described in U.S. Pat. No. 4,608,275 to Kukanskis, et al. One-step catalysts also are known which do not require acceleration, such as the organic acid-containing compositions described in Canadian Patent No. 1,199,754 of Rhodenizer. Following activation, an electroless metal (e.g., copper, nickel) depositing solution is brought into contact with the activated surfaces. These solutions may be of the formaldehyde-reduced variety or may be based upon other types of reducing agents, such as hypophosphite. See, e.g., U.S. Pat. Nos. 4,209,331 and 4,279,948.

As previously noted, prior to the electroless metallization, it is generally preferred and desirable to insure that residual manganese compounds on the through-hole surfaces, resulting from the permanganate treatment, be removed and/or neutralized. While water rinsing may be capable of effecting this removal, it generally is preferred to utilize neutralizing or reducing agents such as hydroxylamine or salts thereof.

Among the features of the present invention is the use of a water-immiscible organic liquid, preparatory to the alkaline permanganate treatment of the through-holes, for those insulating substrates which can effectively and efficiently be acted upon with water-immiscible organic liquids. Notable in this regard are the epoxy-based printed circuit board materials which, for reasons already noted, have in the past been softened or swelled preparatory to a permanganate treatment using water-soluble solvents (e.g., ketones, ethers, ether alcohols and the like) or aqueous solutions containing these solvents. In the present invention, the organic liquids utilized for epoxy-based boards and other like insulating substrate materials are of the substantially water-immiscible type, and preferably are selected from organic liquids represented by the structural formula

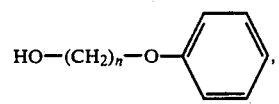

where n is an integer from 1 to 4 and preferably 2 or 3. Particularly preferred are the water-immiscible ethylene and propylene glycol phenyl ethers, such as those available from Dow Chemical Company, Midland, Mich., under trade name Dowanol EPh and Dowanol PPh.

The functionality of the water-immiscible organic liquid (or composition containing it) in the present invention is to act upon the insulating substrate material in a way which enhances the effectiveness of the subsequent permanganate treatment, i.e., with respect to the permanganate's cleaning or desmearing capability and/or its capability in etching back through hole surfaces and/or its capability in generally effecting a micro-roughening and/or alteration of topography of through-hole surfaces either as part of a cleaning or desmearing or etch-back process or, alternatively, as a post-desmearing or post-etch-back treatment. Generally speaking, the water-immiscible organic liquid or composition containing it penetrates and/or softens and/or swells the insulating substrate material as the means by which subsequent permanganate functionality is enhanced. However, the specific method by which the water-immiscible organic liquid operates on the insulating substrate material to enhance the effectiveness of the subsequent permanganate treatment is not entirely understood, may be other than penetration or softening or swelling, and may differ for particular water-immiscible organic liquids and particular insulating substrate materials. For this reason, the functionality of the water-immiscible organic liquid is referred to herein as acting upon the insulating substrate material so as to enhance the subsequent effectiveness of a permanganate treatment of through-holes formed in boards composed of that substrate material. As noted, the effectiveness of the permanganate treatment generally has reference to its micro-roughening or topography-altering capability vis-a-vis the insulating substrate (in terms of increased degree of roughening or etching and/or improved topography), but also can have reference to cleaning or desmearing or etch-back capability. As such, the choice of particular water-immiscible organic liquid may, at least in part, take into account the purpose for which the subsequent permanganate treatment is employed. Also generally speaking, the water-immiscible organic liquid will be a solvent for the particular insulating substrate material; however, since this is not always the case, the present application makes use of the terminology water-immiscible organic liquid to define the liquid organics used to contact the insulating substrate, such terminology embracing liquid organics which may or may not literally be solvents for the substrate. Also, water-immiscible as used herein is intended to embrace liquid organic materials which are at least substantially immiscible in water.

In the most preferred embodiment of the invention, the water-immiscible organic liquid is admixed with water and at least one water-soluble alkali metal compound, typically an alkali metal hydroxide, carbonate, silicate, phosphate or the like, and most preferably an alkali metal hydroxide such as caustic, and this admixture then processed to provide a substantially homogeneous, substantially clear mixture through the use of materials such as surfactants, wetting agents, coupling agents, or emulsifiers of the type and in the amount required to result in the desired mixture characteristics regarding clarity and homogeneity. As noted, operation of the process with compositions of this type is advantageous in terms of facilitating contact and rinsing owing to the presence of the aqueous component. However, its most important advantage is in providing a pre-permanganate process which will have across-the-board excellent functionality irrespective of the composition of the insulating substrate material of the circuit boards. Thus, compositions of the type described provide the water-immiscible organic liquid found to be effective in treatment of epoxy-based and other like substrate materials, while at the same time providing the alkali metal compound found to enhance effectiveness in other substrate materials such as those which are polyimide-based.

Typical compositions of the type described preferably will contain the alkali metal compound in as great an amount as can be employed while still retaining the substantial homogeneity and substantial clarity required to insure uniformity and uniform effectiveness in the composition as a pre-permanganate treatment. Typically, the amount of alkali metal compound employed will be in the range of from about 0.1 to about 15% by weight, preferably from about 2 to 8% by weight, and most preferably from about 3 to 7% by weight. Typical compositions will contain on the order of 30 to 75% water by weight, preferably about 40 to 60% by weight, and water-immiscible organic liquid in an amount of from about 5 to 30% by weight, preferably from about 8 to 20% by weight, and most preferably from about 8 to 12% by weight.

With respect to the surfactant or wetting agent or coupling agent or emulsifier in the composition (for ease of reference, referred to herein as the surfactant component, which may be one or a combination of such materials), its choice, and the amount in which it is employed in the composition, are simply those which will result in a substantially homogeneous, substantially clear mixture of all the components under conditions of use (generally elevated temperature) and, most preferably, under ambient conditions as well. This in turn is substantially dependent upon the relative ratios of water and water-immiscible organic liquid and the amount of alkali metal compound present in the composition. The surfactant component can be selected from a wide variety of known compounds having ability (e.g., based upon their hydrophile-lipophile balance or HLB), alone or in combination with other surfactants, to solubilize or otherwise couple water and water-immiscible organic phases into a homogeneous, clear mixture. Typically, the surfactant component will be present in an amount of from about 2 to about 50% by weight, preferably from about 7 to about 25% by weight, and most preferably from about 10 to about 20% by weight of the overall composition. The preferred surfactants for use in the invention are disulfonated alkyl diphenyl oxides, available from Dow Chemical Company, Midland, Michigan, under the trade name Dowfax. The foregoing ranges for the surfactant component are intended to be based upon the surfactant-active portion thereof, recognizing that many commercial surfactants are obtainable only in admixture with water or with other ingredients. For this and other reasons, it should be understood that the criteria regarding the amount of the surfactant component is simply that amount (in whatever form available) which will result in a substantially clear, substantially homogeneous mixture of the particular ingredients, i.e., water, particular water-immiscible organic liquid, particular alkali metal compound, given the particular amounts in which each is present, and that the above-stated ranges for the surfactant component are intended only as general guidelines. Also, to the extent any surfactant component is employed which, as purchased, contains compounds in addition to the active surfactant material, care obviously must be taken that such additional compounds not be inconsistent in any way with the intended functionality of the homogeneous, clear mixture according to the invention herein in which the surfactant component is used. Still further, to the extent the surfactant component might itself, as purchased, contain ingredients (e.g., alkali metal compounds) which are intentionally present in the homogeneous, clear mixture used according to the invention herein, the amount of any such compounds in the surfactant component obviously is taken into account in formulation of the homogeneous, clear mixture according to the invention.

Typically the pH of compositions of the type described will range from about 8 to about 14 depending largely upon the amount and type of alkali metal compound present, the preferred pH being in the range of from about 8 to about 13. In less preferred embodiments of the invention, advantages are realized utilizing compositions without alkali metal compounds, i.e., admixtures of water and water-immiscible organic material rendered substantially homogeneous and clear through use of a surfactant component. In such cases, the pH of the composition generally will be close to neutral.

The conditions under which contact of the through-hole surfaces with the water-immiscible organic liquid or composition will be conducted may vary widely depending upon the particular water-immiscible organic liquid or components of the composition and the particular insulating substrate material of the board. Generally, the treatment temperature for the water-immiscible organic liquid or composition will be in the range of from about room temperature to about 170° F., preferably from about 130° to 150° F., and the time of contact (e.g., residence time of the board in a tank of the organic liquid or composition) will be on the order of anywhere from, e.g., 1 to 20 minutes, and more typically about 2 to 10 minutes.

Following a water rinse, the through-hole surfaces are then contacted with the aqueous alkaline permanganate solution. This solution is generally comprised of water, a water-soluble salt of permanganate and sufficient alkali to obtain a solution pH in the alkaline range, and preferably a pH of at least about 13.0. Typically, the solution will contain the water-soluble salt of permanganate in a concentration of from about 1 g/l to saturation, and most preferably from about 40 to 250 g/l. Treatment with the permanganate solution generally will be at an elevated temperature (e.g., from about 130° F. to about 180° F., and most preferably from about 160° to 170° F.), and for a time (e.g., from about 3 to 20 minutes) sufficient to effect the conditioning (e.g., desmearing and/or etch-back and/or further alteration of surface topography) needed to result in improved catalyst adsorption and improved adhesion of an essentially void-free electroless metal deposit on the through-hole surfaces.

The invention is further described with reference to the following examples.

EXAMPLES 1-18

A series of experiments were conducted utilizing a number of different multilayer printed circuit board materials and a number of different compositions preparatory to permanganate treatment.

The boards treated were identical in all respects except for the material of the insulating substrate. Thus the first series of boards (Sample 1) were epoxy-based boards available under the tradename N.V.F.; the second series of boards (Sample 2) also were epoxy-based, available under trade name Polyclad Tetrafunctional; and the third series of boards (Sample 3) were polyimide-based, available under tradename Nelco Polyimide.

Six (6) different compositions were employed as pre-permanganate treatments. Sample A was a 50% (by weight) solution of caustic in water. Sample B was 100% by weight N-methylpyrrolidone. Sample C was 50% by weight N-methylpyrrolidone in water. Sample D was 100% by weight water-immiscible ethylene glycol phenyl ether (Dowanol EPh). Sample E was 50% by weight Dowanol EPh dispersed in water. Sample F was a substantially homogeneous, substantially clear mixture containing (by weight) 45% water, 17% Dowanol EPh, 5% caustic, and 33% surfactants (50:50 mixture of Triton BG-10 and Dowfax 2A1, the latter being in the form of a 45% weight mixture of active ingredient with water, and the former being 70% active, with the remaining 30% being 15% caustic and 15% water).

The cycle to which each of the through-hole-containing boards was subjected was as follows. Five (5) minutes contact with the composition at 150° F.; two (2) minute water rinse at ambient temperature; fifteen (15) minute contact with potassium permanganate solution (50 g/l.; pH=13.0) at 165° F; two three (3) minute rinses with water at ambient temperature; and five (5) minute contact at 110° F. with a neutralizing solution of hydroxylamine and hydrochloric acid.

For each sample, an etch rate was determined based upon measurement of the weight loss resulting from the processing. In addition, inspection of surface topography of the through-hole was made by means of scanning electron microscopic photography, and, for each series of board samples, the topographic results were ranked as best (5) to worst (1). The results are set forth in Table I.

TABLE I

| Example | Description | Etch-Rate (% wt. loss) | Topography |
|---|---|---|---|
| 1 | 1A | .136 | 1 |
| 2 | 1B | .210 | 4 |
| 3 | 1C | .197 | 2 |
| 4 | 1D | .227 | 4 |
| 5 | 1E | .180 | 1 |
| 6 | 1F | .210 | 4 |
| 7 | 2A | .151 | 1 |
| 8 | 2B | .197 | 5 |
| 9 | 2C | .188 | 3 |
| 10 | 2D | .224 | 5 |
| 11 | 2E | .116 | 2 |
| 12 | 2F | .201 | 5 |
| 13 | 3A | .231 | 4 |
| 14 | 3B | .154 | 1 |
| 15 | 3C | .139 | 1 |
| 16 | 3D | .183 | 2 |
| 17 | 3E | .122 | 1 |
| 18 | 3F | .213 | 4 |

From these results, it can be seen that the water-immiscible Dowanol EPh is highly effective as a pre-permanganate treatment for both epoxy and polyimide multilayer boards; that a composition containing caustic is highly effective for polyimide boards but of very low effectiveness for epoxy boards; and that single compositions can be formulated to provide uniformly excellent effectiveness for both epoxy and polyimide boards.

In terms of the preferred aspects of the invention, a water-immiscible organic liquid is employed as a pre-treatment for through holes preparatory to treatment of the through holes with alkaline permanganate in processes for cleaning, and/or desmearing and/or etching back and/or conditioning the through hole surfaces for subsequent metallization. The water-immiscible organic liquid may be used alone, but preferably is used in combination with water along with a surfactant which brings about a substantially homogeneous, substantially clear mixture. Most preferably, the water-immiscible organic liquid is used in association with water and water-soluble alkali metal compounds, again with effective amounts of a surfactant component to provide a substantially homogeneous, substantially clear mixture among all the components. Although not preferred as such, in any of the foregoing embodiments there may additionally be present water-soluble organic liquids.

Having thus described the invention, it is to be noted, and will be readily understood by those in the art, that various other modifications or alternatives are possible without departing from the scope or spirit of the invention, as defined by the appended claims.

What is claimed is:

1. In a process for treating the surfaces of a through-hole formed in a printed circuit board to prepare the through-hole surfaces for subsequent metallization, said printed circuit board being comprised of at least two alternating layers of circuitry separated by an insulating substrate material comprised of a material selected from the group consisting of epoxy and polyimide, wherein said through-hole surfaces are contacted with an aqueous alkaline solution comprising permanganate ions at conditions effective to prepare said surfaces for metallization, and wherein said contact with said alkaline solution comprising permanganate ions is preceded by contact of said through-hole surfaces with a pretreatment compound or composition effective to enhance the subsequent permanganate treatment; the improvement wherein said pretreatment compound or composition is effective to enhance said subsequent permanganate treatment irrespective of whether said insulting substrate material is comprised of epoxy or polyimide, said pretreatment compound or composition comprising a pretreatment mixture comprised of water, an organic liquid which is immiscible with said water at the concentration of said organic liquid employed in said pretreatment mixture, and a water-soluble alkali metal compound, said pretreatment mixture further comprising a surfactant component in an amount which results in said pretreatment mixture being substantially homogeneous and substantially clear.

2. In a process for treating the surfaces of a through-hole formed in a multilayer printed circuit board to prepare the through-hole surfaces for subsequent metallization, said multilayer printed circuit board being comprised of alternating layers, including at least one innerlayer, of circuitry separated by an insulating substrate material comprised of a material selected from the group consisting of epoxy and polyimide, and wherein said through-hole surfaces are contacted with an aqueous alkaline solution comprising permanganate ions at conditions effective to prepare said surfaces for metallization, and wherein said contact with said alkaline solution comprising permanganate ions is preceded by contact of said through-hole surfaces with a pretreatment compound or composition effective to enhance the subsequent permanganate treatment; the improvement wherein said pretreatment compound or composition is effective to enhance said subsequent permanganate treatment irrespective of whether said insulting substrate material is comprised of epoxy or polyimide, said pretreatment compound or composition comprising a pretreatment mixture comprised of water, an organic liquid which is immiscible with said water at the concentration of said organic liquid employed in said pretreatment mixture, and a water-soluble alkali metal compound said pretreatment mixture further comprising a surfactant component in an amount which results in said pretreatment mixture being substantially homogeneous and substantially clear.

3. In a process for treating the surfaces of a through-hole formed in a multilayer printed circuit board, said multilayer printed circuit board being comprised of alternating layers, including at least one innerlayer, of circuitry separated by an insulating substrate material comprised of a material selected from the group consisting of epoxy and polyimide, so as to remove substrate material smear from the surfaces of aid innerlayer exposed in said through-hole, wherein said through-hole surfaces are contacted with an aqueous alkaline solution comprising permanganate ions under conditions effective to remove said smeared substrate material from said innerlayer surfaces exposed in said through-hole, and wherein said contact with said alkaline solution comprising permanganate ions is preceded by contact of said through-hole surfaces with a pretreatment compound or composition effective to enhance the subsequent permanganate treatment; the improvement wherein said pretreatment compound or composition is effective to enhance said subsequent permanganate treatment irrespective of whether said insulating substrate material is comprised of epoxy or polyimide, said pretreatment compound or composition comprising a pretreatment mixture comprised of water, an organic liquid which is immiscible with said water at the concentration of said organic liquid employed in said pretreatment mixture, and a water-soluble alkali metal compound, said pretreatment mixture further comprising a surfactant component in an amount which results in said pretreatment mixture being substantially homogeneous and substantially clear.

4. In a method for treating the surfaces of a through-hole formed in a multilayer printed circuit board to prepare the through-hole surfaces for subsequent metallization, said multilayer printed circuit board being comprised of alternating layers, including at least one innerlayer, of circuitry separated by an insulating substrate material comprised of a material selected from the group consisting of epoxy and polyimide, in which said through-hole is subjected to a desmearing process to remove substrate material smear from the surfaces of said inner-layer exposed in said through-hole and thereafter contacted with an aqueous alkaline solution comprising permanganate ions under conditions effective to prepare said surfaces for metallization, and wherein said contact with said alkaline solution comprising permanganate ions is preceded by contact of said through-hole surfaces, after said desmearing, with a pretreatment compound or composition effective to enhance the subsequent permanganate treatment; the improvement wherein said pretreatment compound or composition is effective to enhance said subsequent permanganate treatment irrespective of whether said insulating substrate material is comprised of epoxy or polyimide, said pretreatment compound or composition comprising a pretreatment mixture comprised of water, an organic liquid which is immiscible with said water at the concentration of said organic liquid employed in said pretreatment mixture, and a water-soluble alkali metal compound, said pretreatment mixture further comprising a surfactant component in an amount which results in said pretreatment mixture being substantially homogeneous and substantially clear.

5. A process for treating the surfaces of a through-hole formed in a printed circuit board to prepare the through-hole surfaces for subsequent treatment with an alkaline solution comprising permanganate ions preparatory to metallizing said through-holes, said printed circuit board being comprised of at least two alternating layers of circuitry separated by an insulating substrate material comprised of a material selected from the group consisting of epoxy and polyimide, said process comprising contacting said through-hole surfaces with a pretreatment mixture which enhances said subsequent permanganate treatment irrespective of whether said insulating substrate material is comprised of epoxy or polyimide, said pretreatment mixture being comprised of water, water-soluble alkali metal compound and an organic liquid which is immiscible with said water at the concentration of said organic liquid employed in said pretreatment mixture, said pretreatment mixture further comprising a surfactant component in an amount which results in said pretreatment mixture being substantially homogeneous and substantially clear.

6. A process according to any of claims 1, 2, 3, 4 or 5, wherein said insulating substrate material is comprised of polyimide.

7. A process according to any of claims 1, 2, 3, 4 or 5, wherein said insulating substrate material is comprised of epoxy.

8. A process according to any of claims 1, 2, 3, 4 or 5, wherein said water-soluble alkali metal compound is selected from the group consisting of alkali metal hydroxide, alkali metal carbonate, alkali metal silicate, alkali metal phosphate, and mixtures thereof.

9. A process according to any of claims 1, 2, 3, 4 or 5, wherein said water-soluble alkali metal compound is caustic, and wherein said caustic is present in an amount up to about 10% by weight of said mixture.

10. A process according to any of claims 1, 2, 3, 4 or 5, wherein said organic liquid is selected from the group consisting of ethylene glycol phenyl ether, propylene glycol phenyl ether, and mixtures thereof.

* * * * *